United States Patent [19]
Good et al.

[11] Patent Number: 5,477,142
[45] Date of Patent: Dec. 19, 1995

[54] VARIABLE RELUCTANCE SENSOR INTERFACE USING A DIFFERENTIAL INPUT AND DIGITAL ADAPTIVE CONTROL

[75] Inventors: Brian K. Good, Greentown; Mark R. Keyse, Sharpsville, both of Ind.

[73] Assignee: Delco Electronics Corporation, Kokomo, Ind.

[21] Appl. No.: 200,099

[22] Filed: Feb. 22, 1994

[51] Int. Cl.$^6$ .............................. G01P 3/48; H03K 5/08
[52] U.S. Cl. ................................. 324/166; 327/4
[58] Field of Search .................... 324/160, 166, 324/173, 174, 207.25; 327/4, 165, 72, 73, 74, 102, 48, 76, 510; 364/565

[56] References Cited

U.S. PATENT DOCUMENTS

| | | | |
|---|---|---|---|
| 3,801,830 | 4/1974 | Boyer | 307/235 R |
| 4,449,102 | 5/1984 | Frazer | 327/165 |
| 4,788,456 | 11/1988 | Urman et al. | 327/73 |
| 4,866,298 | 9/1989 | Kniss et al. | 307/268 |
| 4,868,498 | 9/1989 | Lusinchi et al. | 324/173 |
| 4,962,470 | 10/1990 | Hansen | 364/572 |
| 5,029,286 | 7/1991 | Kirschner | 324/173 |
| 5,144,233 | 9/1992 | Christenson et al. | 324/207.25 |
| 5,233,292 | 8/1993 | Nagata et al. | 324/166 |
| 5,274,326 | 12/1993 | Bleckmann et al. | 324/166 |

OTHER PUBLICATIONS

U.S. patent application Ser. No. 08/168,298, filed Dec. 17, 1993, by Hansen et al. (Pending U.S. appl.).
David K. Long, "An Adaptive Sense Amplifier For Engine Control Applications", Paper No. 770435, Society of Automotive Engineers International Automotive Engineering Congress and Exposition, Cobo Hall, Detroit, Michigan Feb. 28–Mar. 4, 1977.

*Primary Examiner*—Sandra L. O'Shea
*Assistant Examiner*—Roger Phillips
*Attorney, Agent, or Firm*—Jimmy L. Funke

[57] ABSTRACT

In accordance with the teachings of the present invention, an adaptive threshold circuit is provided which develops a series of square-wave voltage pulses from an alternating differential voltage that is produced in response to the rotation of a wheel. The adaptive threshold circuit includes an input circuit for providing an input voltage in response to the alternating differential voltage. A first voltage comparator compares the input voltage with an adaptive analog threshold voltage and produces an output in response thereto which causes a rising edge of the square-wave voltage pulse. A second voltage comparator compares a selected portion of the input voltage with the adaptive analog threshold voltage and produces an output in response thereto. The adaptive threshold circuit further includes a binary counter having a reset input for receiving the first voltage comparator output and an enable input for receiving the second voltage comparator output and provides a plurality of binary outputs. The second voltage comparator output thereby enables the counter so as to detect a peak input voltage. A digital-to-analog converter receives the binary outputs from the binary counter and generates the adaptive analog threshold voltage as a function of a selected percent of peak voltage.

7 Claims, 7 Drawing Sheets

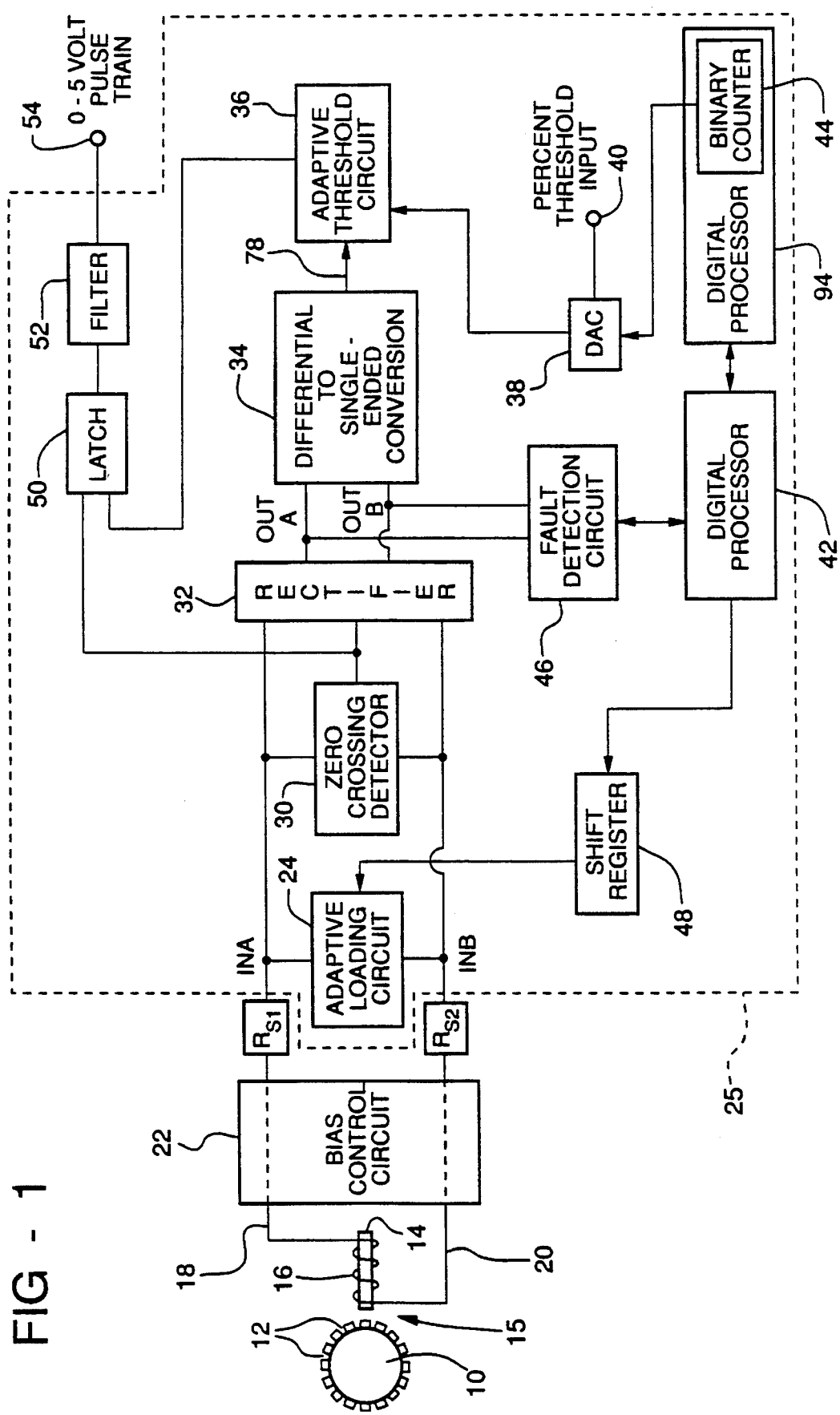

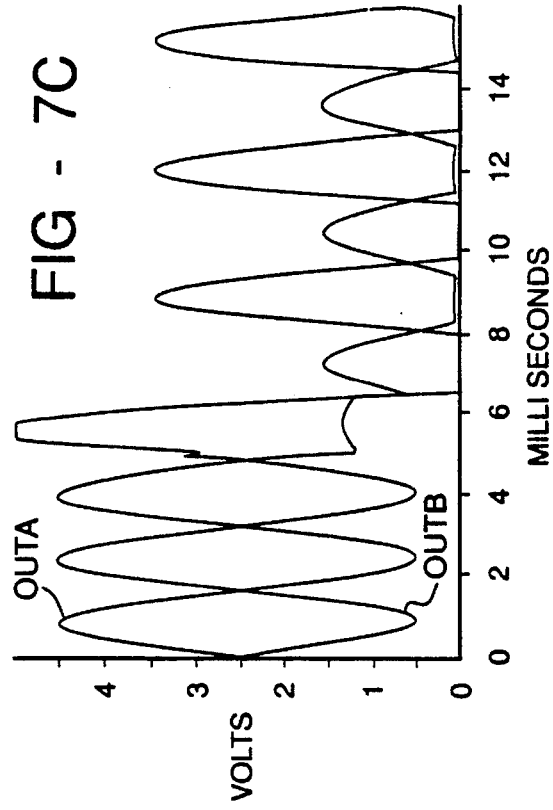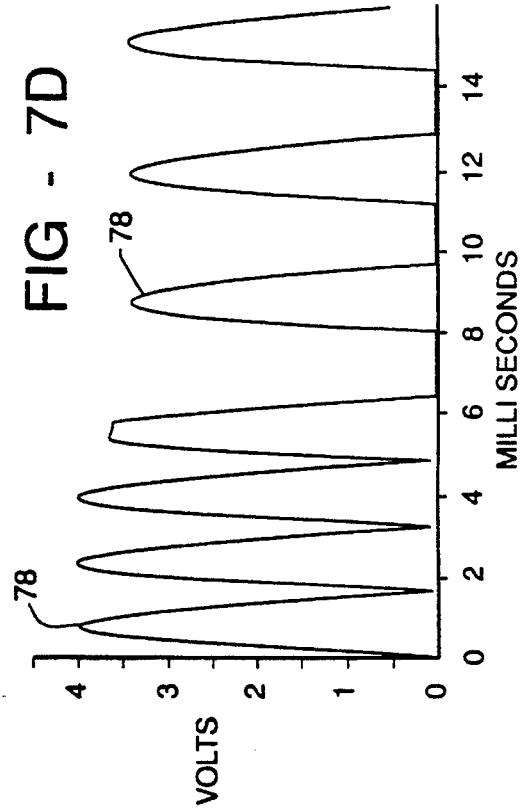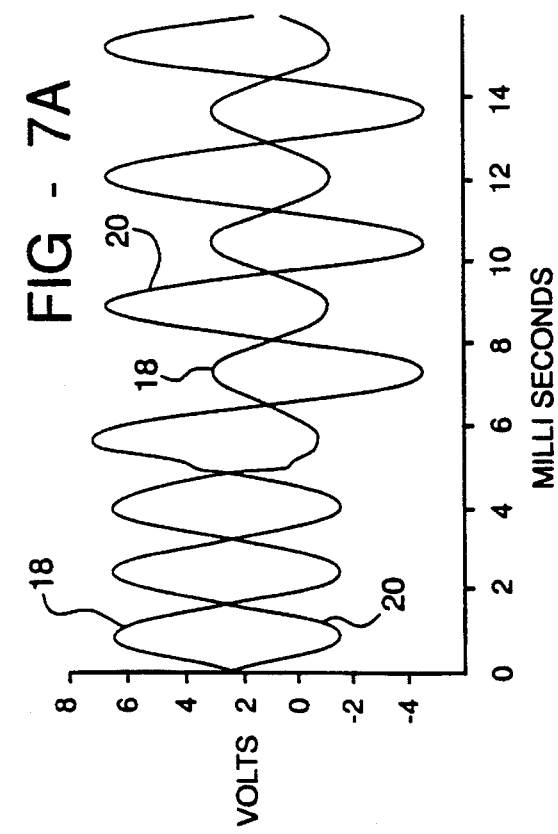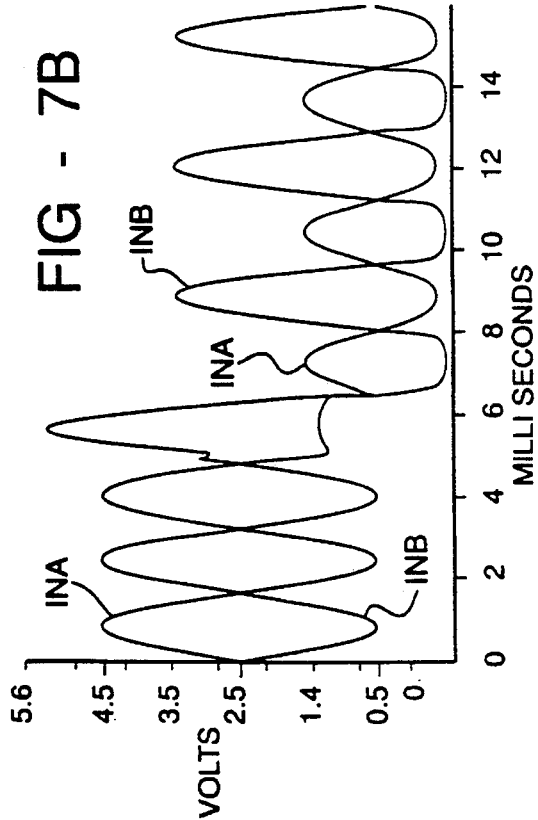

VARIABLE RELUCTANCE SENSOR INTERFACE USING A DIFFERENTIAL INPUT AND DIGITAL ADAPTIVE CONTROL

BACKGROUND OF THE INVENTION

1. Technical Field

This invention relates generally to an adaptive threshold circuit and, more particularly, to an adaptive threshold circuit for use with a magnetic or variable reluctance sensor that produces an alternating differential voltage in response to rotation of a wheel.

2. Discussion

Inductive magnetic sensors are commonly employed for automotive applications and the like to provide timing signals which enable the determination of position and speed of a rotating wheel. For example, specific applications may include the determination of engine crankshaft position and speed (i.e., RPM) or the determination of wheel speed for anti-lock braking systems. Inductive magnetic sensors used for these types of applications are commonly referred to as variable reluctance sensors.

The variable reluctance sensor is generally located adjacent to a rotating wheel which typically has a plurality of circumferentially spaced slots formed therein. The sensor has an inductive magnetic pick-up that is generally made up of a pick-up coil wound on a permanent magnetic core. As the wheel rotates relative to the pick-up coil, an alternating voltage is generated in the pick-up coil when the slots on the wheel move past the sensor. The frequency of the alternating voltage is then determined to achieve rotational speed information about the wheel.

The alternating voltage that is produced with the variable reluctance sensor has peak voltages that are proportional to the speed of rotation of the wheel. In a number of automotive applications, the peak voltage generated typically may vary from approximately 250 millivolts (mV) at low end speeds to over 160 volts (V) at higher speeds. In fact, some sensors are rated to generate up to 200 volts (V). In order to properly decode the sensor output, a receiving circuit is generally required to adapt the threshold voltage so that a processor or other control device may recognize a positive or high voltage level. Ultimately, the output signal may have to be in the form of a digital 0–5 volt pulse train, with which the processor may use the pulse width variation, for example, to determine the wheel speed or position.

In the past, a number of problems have existed which relate to noise that is created by external sources or defects in some component of the system. For instance, high voltage ignition coils may injects noise into sensor wires located nearby. Also, dirt or scratches existing on the surface of the wheel may cause noise which increases in proportion to the speed of the wheel. Other sources of noise may include manufacturing flaws in the wheel such as unequally formed slots in the wheel or off-center wheel alignment which may cause "wobble" or "run out". At high speeds, such noise could be several volts in amplitude and could cause false edges to occur at the output.

One proposed solution to the noise problem utilizes an analog circuit that has adaptive threshold control. One such analog circuit is discussed in U.S. Pat. No. 5,144,233 issued to Christensen et al. However, the analog adaptive control approaches generally have a number of drawbacks associated therewith. First, the analog approach commonly requires an accurate external capacitor to timely store a voltage as the next threshold. Second, unwanted noise spikes in the system can modify the charge stored on the capacitor which in turn can cause inaccuracies with the next input switchpoint. Third, processing variations may cause parametric changes in operation of the analog circuitry. Finally, conventional adaptive control approaches are designed for sensors which generate single-ended voltages, instead of a differential voltage.

One of the objects of this invention is to provide an adaptive threshold circuit that is capable of processing a voltage signal generated by a variable reluctance sensor over a selectable range.

Another object of this invention is to provide an adaptive threshold circuit that generates adaptive thresholds for determining the frequency of a detected signal while providing adaptive control signals for controlling an adaptive loading circuit with a differential voltage.

Still another more specific object of this invention is to provide for an adaptive threshold circuit which includes a counter and a digital-to-analog converter for generating a series of voltage pulses generated from a differential voltage produced by a variable reluctance sensor, and which does not require a capacitor of the type required for analog threshold circuits.

SUMMARY OF THE INVENTION

In accordance with the teachings of the present invention, an adaptive threshold circuit is provided which develops a series of square-wave voltage pulses from an alternating differential voltage that is produced in response to the rotation of a wheel. The adaptive threshold circuit includes an input circuit for providing an input voltage in response to the alternating differential voltage. A first voltage comparator compares the input voltage with an adaptive analog threshold voltage and produces an output in response thereto which causes a rising edge of the square-wave voltage pulse. A second voltage comparator compares a selected portion of the input voltage with the adaptive analog threshold voltage and produces an output in response thereto. The adaptive threshold circuit further includes a binary counter having a reset input for receiving the first voltage comparator output and an enable input for receiving the second voltage comparator output and provides a plurality of binary outputs. The second voltage comparator output thereby enables the counter so as to generate a count magnitude which is a function of the peak input voltage. A digital-to-analog converter receives the binary outputs from the binary counter and generates the adaptive analog threshold voltage as a function of a selected percent of peak voltage.

This application is one of several applications filed on the same date, all commonly assigned and having similar specifications and drawings, these applications being identified below:

| U.S. Ser. No. | Title |
| --- | --- |
| 08/200,098 | ADAPTIVE LOADING SCHEME FOR A DIFFERENTIAL INPUT |
| 08/200,027 | DIFFERENTIAL TO SINGLE-ENDED CONVERSION SCHEME FOR AN ADAPTIVE THRESHOLD CIRCUIT |
| 08/199,921 | FAULT DETECTION SCHEME FOR A VARIABLE RELUCTANCE SENSOR INTERFACE HAVING A DIFFERENTIAL INPUT AND ADAPTIVE CONTROL |

BRIEF DESCRIPTION OF THE DRAWINGS

Other objects and advantages of the present invention will become apparent to those skilled in the art upon reading the following detailed description and upon reference to the drawings in which:

FIG. 1 is a block diagram which illustrates a variable reluctance sensor interface module for interfacing a variable reluctance sensor with a processing module in accordance with the present invention;

FIGS. 7A through 7D are graphical representations which illustrate voltage waveforms measured during the operation of a short circuit fault detection and correction scheme.

DETAILED DESCRIPTION OF THE PREFERRED EMBODIMENTS

Figure 2A:
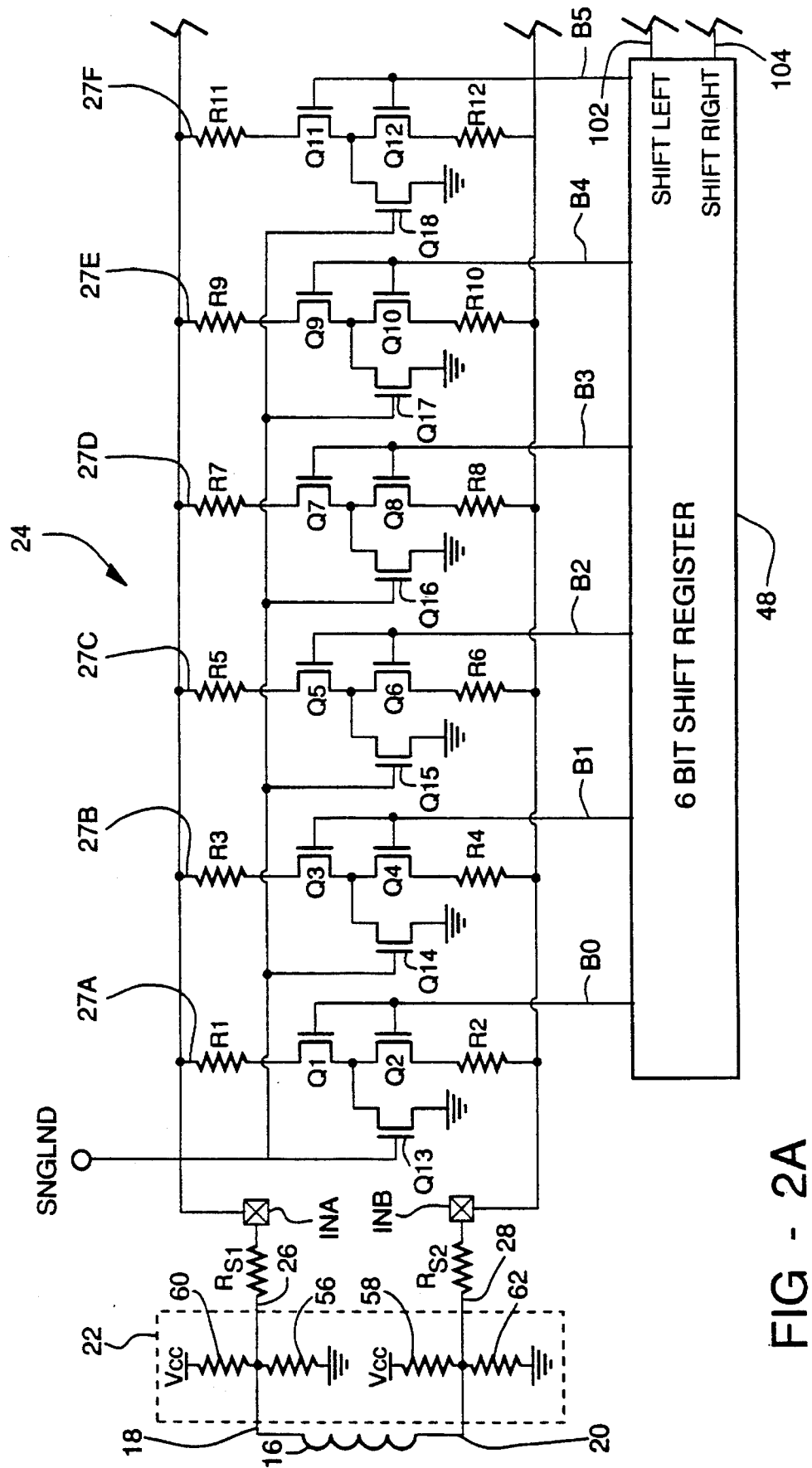
FIGS. 2A and 2B are circuit diagrams which when taken together illustrate the variable reluctance sensor interface module as shown in FIG. 1.
Figure 2B:
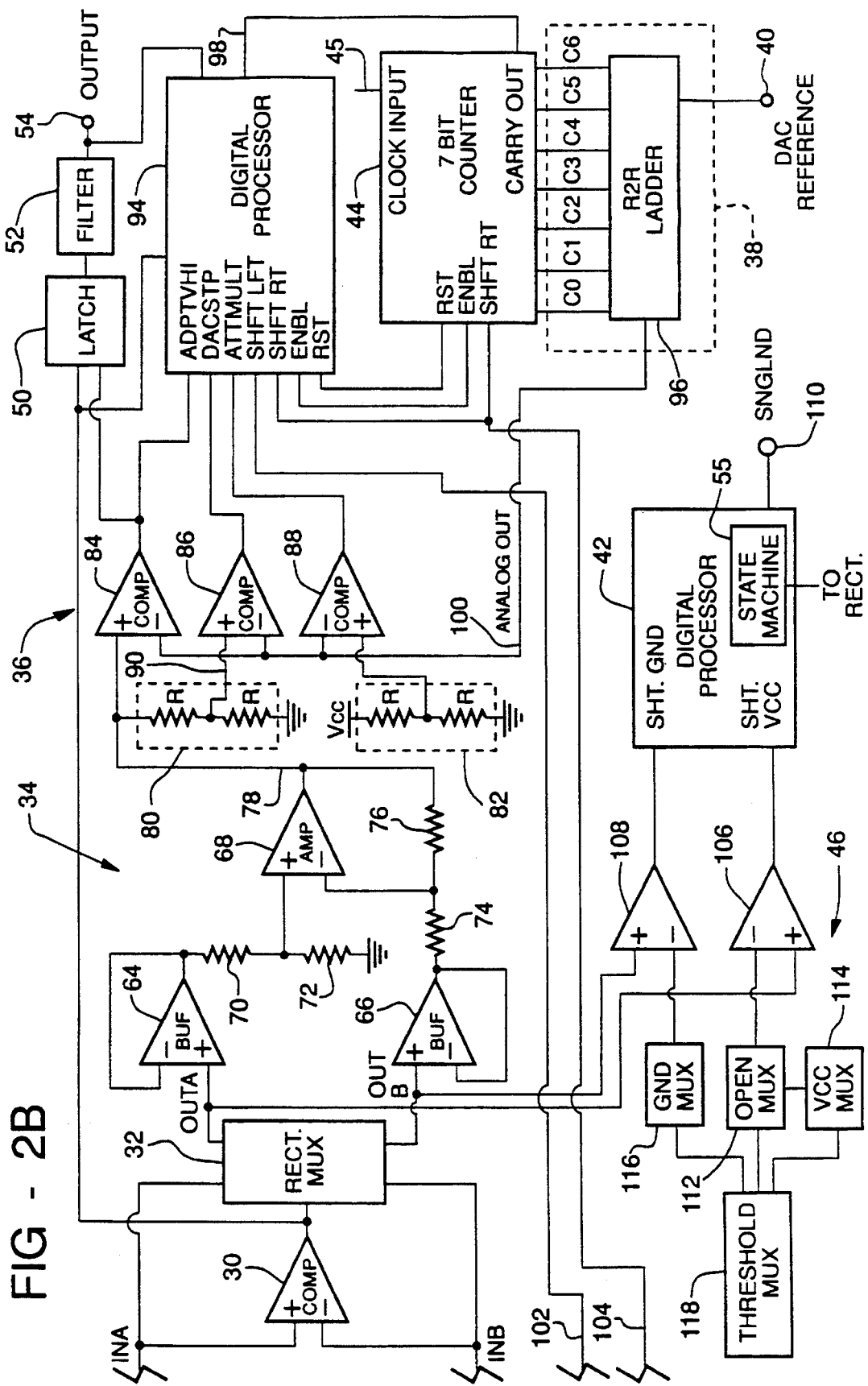

Referring now to FIGS. 1, 2A and 2B, a variable reluctance sensor interface module 25 is shown therein for interfacing a variable reluctance sensor 15 with a processing module (not shown). The variable reluctance sensor interface module 25 is adapted to be used in a vehicle (not shown), such as an automobile. More particularly, this invention will be described for use in sensing rotational wheel speed for systems such as anti-lock braking systems. However, it is to be understood that the use of this invention is not restricted to automobiles and anti-lock braking systems, but could have other uses such as determining engine crankshaft position and speed for a distributorless ignition system (DIS).

With particular reference to FIG. 1, a rotatable wheel 10 is shown which may be driven in conjunction with a wheel/tire assembly found on a vehicle such as an automobile. The wheel 10 has a plurality of slots 12 that are preferably evenly spaced from each other about the outer periphery of the wheel 10. In a distributorless ignition system (DIS) application for a spark ignited internal combustion engine, an additional slot may be employed for purposes of synchronizing the distributorless ignition system in a manner known to those skilled in the art.

A variable reluctance magnetic pick-up or magnetic sensor 15 is disposed adjacent to the outer periphery of wheel 10. The magnetic sensor 15 includes a magnetic pick-up made up of a permanent magnet 14 which has a core formed of magnetic material and a pick-up coil 16 that is wound on the permanent magnet 14. The magnetic sensor 15 has a first sensor output line 18 connected to one side of pick-up coil 16 and a second sensor output line 20 connected to the other side of pick-up coil 16.

As the plurality of slots 12 on wheel 10 rotate past the end of magnetic sensor 15, an alternating differential voltage is induced or generated on the pick-up coil 16. The differential voltage waveform generated on pick-up coil 16 is transmitted onto first and second sensor output lines 18 and 20 as a series of two alternating voltages which are 180 degrees out of phase relative to one another. Each cycle of the alternating voltage represents the passage of one of slots 12 past the end of the magnetic sensor 15. Accordingly, each voltage cycle occurs at predetermined angularly spaced positions as found on wheel 10. In effect, the peak-to-peak voltage potential existing between sensor output lines 18 and 20 represents the amplitude of peak-to-peak voltage created by the changing or varying reluctance of the magnetic field produced by magnetic sensor 15.

A bias control circuit 22 is connected to sensor output lines 18 and 20. Referring now also to FIG. 2, bias control circuit 22 includes first and second resistors 60 and 56 connected between a direct current (DC) voltage supply $V_{cc}$ and ground and further connected together via a common node on sensor output line 18. In addition, bias control circuit 22 has third and fourth resistors 58 and 62 likewise connected between a direct current (DC) voltage supply $V_{cc}$ and ground and further connected together at a common node on sensor output line 20. DC voltage supply $V_{cc}$ preferably is set equal to five volts (5 V) and resistors 56, 58, 60 and 62 each have an equal resistance of approximately 50 Kilohms (50 k$\Omega$).

Figure 3:
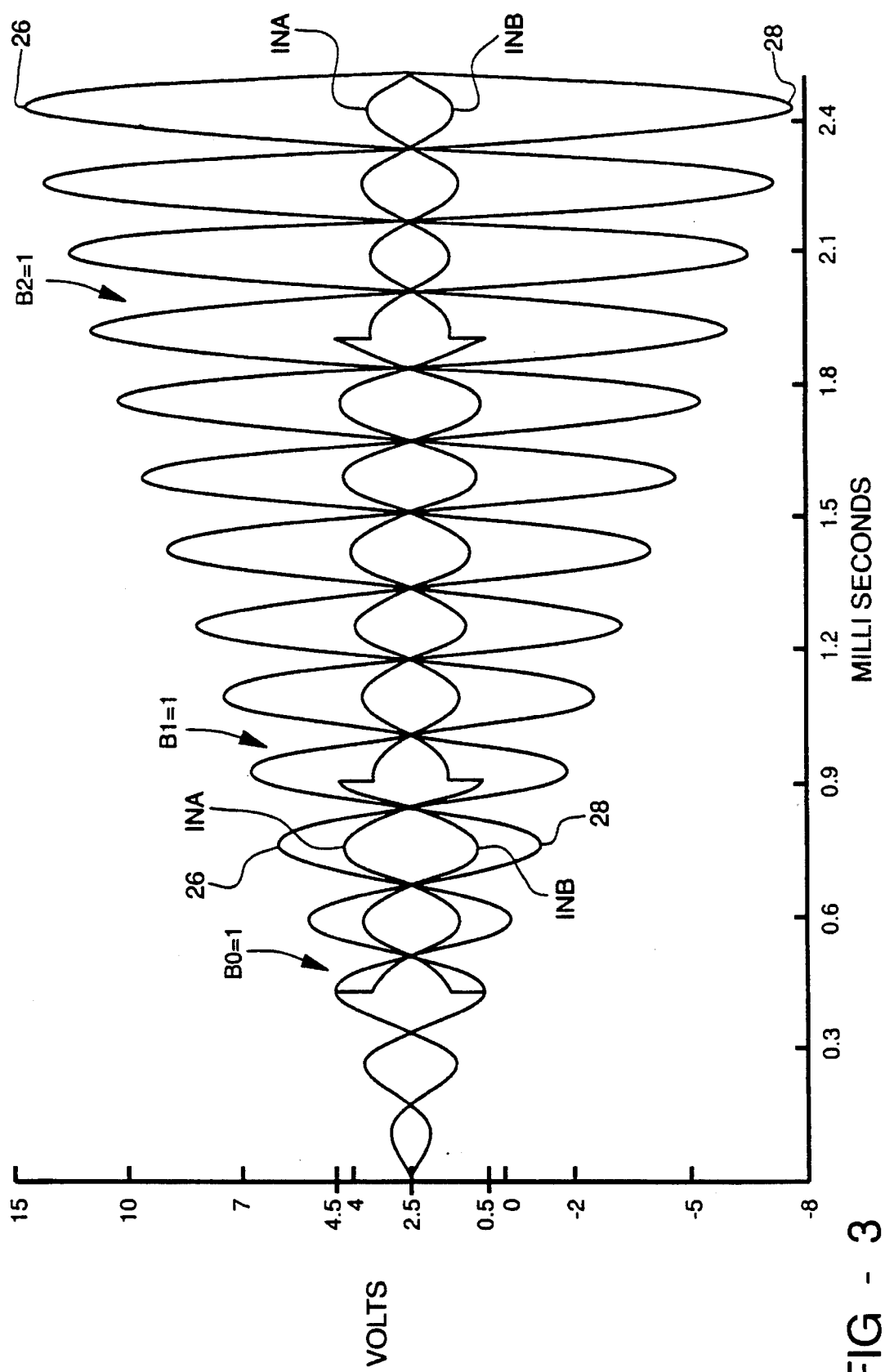
FIG. 3 is a graphical representation of an input differential voltage produced by a variable reluctance sensor and an adaptively attenuated differential voltage produced by an adaptive loading circuit.

The bias control circuit 22 provides a DC bias voltage level that is set to approximately mid-supply of the 5 volt supply $V_{cc}$, which is approximately 2.5 volts. Accordingly, the alternating differential input voltage is offset by +2.5 volts DC and therefore is symmetric about the DC bias voltage. The DC bias therefore allows the differential voltages output from bias control circuit 22 to remain positive for voltages ranging between 0–5 volts peak-to-peak. One example of the differential voltage output from bias control circuit 22 found on lines 26 and 28 is shown in FIG. 3. While a particular example of a bias control circuit 22 is shown, other bias control circuit configurations may be employed to provide a DC bias in a manner well known to those skilled in the art.

The bias control circuit 22 is either externally connected to or may include a pair of series load resistors $R_{S1}$ and $R_{S2}$. Load resistor $R_{S1}$ is connected to line 26 in series with the first sensor output line 18 output from the bias control circuit 22. Load resistor $R_{S2}$ is connected to line 28 in series with the second sensor output line 20 output from the bias control circuit 22. Series load resistors $R_{S1}$ and $R_{S2}$ each have a predetermined resistance of approximately 40 Kilohms (40 k$\Omega$) and provide a known series resistive load along sensor output lines 18 and 20.

The variable reluctance sensor interface module 25 has a pair of input pads INA and INB connected to first and second sensor output lines 18 and 20 and associated series load resistors $R_{S1}$ and $R_{S2}$, respectively, for receiving the differential input voltage. The interface module 25 receives the differential input voltage after passing through bias control circuit 22 and series load resistors $R_{S1}$ and $R_{S2}$. The interface module 25 in turn processes the differential voltage and produces as an output a 0–5 volt digital pulse train to a processing module so as to achieve rotational speed information about the wheel 10.

Generally speaking, the interface module 25 includes an adaptive loading circuit 24, a differential to single-ended conversion circuit 34, an adaptive threshold circuit 36 and associated digital-to-analog converter (DAC) 38 and a fault detection circuit 46. The above-identified circuits, associated hardware and processing techniques are discussed in detail in the following text corresponding to the specific headings.

Adaptive Loading Circuit

The adaptive loading circuit 24 is shown in detail in FIG. 2A connected between input pads INA and INB for providing a selected amount of resistive loading across the differential inputs as needed. The series load resistors $R_{S1}$ and $R_{S2}$ are therefore serially connected to the input pads INA and INB, while the adaptive loading circuit 24 is connected between input pads INA and INB. Together, the adaptive loading circuit 24 and load resistors $R_{S1}$ and $R_{S2}$ provide a resistive divider network which attenuates the alternating differential voltage when needed. A differential voltage is therefore provided across input pads INA and INB which is within a selected peak-to-peak voltage range.

More specifically, adaptive loading circuit 24 includes a plurality of resistive branches 27A through 27F connected in parallel with one another. A total of six parallel resistive branches 27A through 27F are illustrated herein, each branch having a pair of resistors and a pair of transistors associated therewith. Each resistive branch is selectively switched "in" or "out" via the plurality of transistors in a successive order when the voltage across input pads INA and INB deviates from the selected voltage range.

The first resistive branch 27A includes a pair of equal value resistors R1 and R2 and a pair of transistors Q1 and Q2, all of which are connected in series between input pads INA and INB. Resistors R1 and R2 each have a resistance of 40 k$\Omega$ which is equal to the resistive load provided by each of series load resistors $R_{S1}$ and $R_{S2}$. Accordingly, the combination of resistors $R_{S1}$, $R_{S2}$, R1 and R2 produces an equivalent resistance necessary to provide a differential voltage across input pads INA and INB that is divided in half.

The second resistive branch 27B is connected in parallel with and adjacent to the first resistive branch 27A and has a pair of equal value resistors R3 and R4 and a pair of transistors Q3 and Q4, all of which are connected in series between input pads INA and INB. Resistors R3 and R4 each have a resistance of 20 k$\Omega$ which is equal to about one-half of the resistive load provided by each of resistors R1 and R2. Together, resistive branches 27A and 27B may provide an equivalent resistance which in combination with resistors $R_{S1}$ and $R_{S2}$ provides a differential voltage across input pads INA and INB that is divided by a factor of four.

The third resistive branch 27C includes equal value resistors R5 and R6 and transistors Q5 and Q6, all connected in series between input pads INA and INB. Resistors R5 and R6 each have a resistance of 10 k$\Omega$ which is equal to approximately one-half the resistive load provided by each of resistors R3 and R4. Together, resistive branches 27A, 27B and 27C may provide an equivalent resistance which in combination with resistors $R_{S1}$ and $R_{S2}$ produces a differential voltage across input pads INA and INB that is divided by a factor of eight.

The fourth resistive branch 27D likewise has equal value resistors R7 and R8 and transistors Q7 and Q8, all connected in series across input pads INA and INB. Resistors R7 and R8 each have a resistance of 5 k$\Omega$ which is equal to about one-half the resistive value provided by each of resistors R5 and R6. The parallel combination of resistive branches 27A through 27D with resistors $R_{S1}$ and $R_{S2}$ may provide a voltage division on input pads INA and INB by a division factor of sixteen.

Similarly, the fifth resistive branch 27E includes a pair of equal value resistors R9 and R10 and a pair of transistors Q9 and Q10, all connected in series across input pads INA and INB. Resistors R9 and R10 each have a resistance of 2.5 k$\Omega$ which is equal to approximately one-half the resistive load provided by each of resistors R7 and R8. The parallel combination of resistive branches 27A through 27E with resistors $R_{S1}$ and $R_{S2}$ may produce a voltage division on input pads INA and INB by a division factor of thirty-two.

Finally, the sixth resistive branch 27F has a pair of equal value resistors R11 and R12 and transistors Q11 and Q12, all connected in series between input pads INA and INB. Resistors R11 and R12 each have a resistance of 1.25 k$\Omega$ which is equal to approximately one-half the resistive load provided by each of resistors R9 and R10. The total combination of all of resistive branches 27A through 27F with resistors $R_{S1}$ and $R_{S2}$ may produce a voltage division on input pads INA and INB with a division factor of sixty-four.

Transistors Q1 through Q12 are n-channel transistors each of which has a gate that is connected to a 6-bit shift register 48 for receiving one of attenuation control bits B0 through B5. Series connected pairs of transistors such as transistors Q1 and Q2 associated with each branch are electrically coupled together at the gate so as to operate in response to the same control bit such as bit B0. Each transistor is serially connected across the corresponding resistive branch. Attenuation control bits B0 through B5 turn on the selected transistors associated therewith with a "high" signal and turn "off" transistors supplied with a "low" signal. In addition, a pair of inverters (not shown) may be coupled between each transistor gate and the shift register 48 to help drive the transistors if needed.

The shift register 48 performs attenuation control and includes a pair of input lines 102 and 104 coupled to a shift-left input and a shift-right input, respectively. Inputs 102 and 104 load the binary attenuation control signals B0 through B5 into shift register 48 to determine which of the parallel resistive branches are to be switched "in" or "out". A high signal on input 102 initiates a "shift left" on register 48 when the voltage across input pads INA and INB decreases to about 240 millivolts peak-to-peak. A "shift left" shifts a logic "low" into the most significant bit and shifts the contents of bit B into bit B−1. A high signal on input 104 initiates a "shift right" on register 48 when the differential voltages across input pads INA and INB reaches about four volts peak-to-peak. A "shift right" shifts a logic "high" into the least significant bit of the shift register 48 and shifts the contents of bit B into bit B+1. Inputs 102 and 104 are further coupled to a threshold circuit 36 and associated binary counter 44, digital processor 94 and DAC 38 as will be described in more detail hereinafter.

In order to provide for a 0–5 volt output range, it is generally preferred that the voltage attenuation occur at a selected percent such as about 80 percent of full scale or four volts for a 0–5 volt range. Accordingly, when the peak-to-peak voltage across sensor output lines 18 and 20 initially remains within 0 to 4 volts peak-to-peak, the parallel resistors R1 through R12 are all switched out with each of binary bits B0 through B5 set equal to zero. As the differential input voltage increases in amplitude to the maximum allowable peak-to-peak voltage of four volts (i.e., 80% of five volts), input 104 initiates a "shift right" on shift register 48 which in effect loads a "high" signal on the first control bit B0. This in turn causes the first pair of transistors Q1 and Q2 to turn "on" so as to cause resistors R1 and R2 to switch "in". With resistive branch 27A switched "in", the resulting voltage attenuation provided at input pads INA and INB is equal to approximately one-half of the input voltage on sensor output lines 26 and 28.

Likewise, as the input differential voltage increases in amplitude to a peak-to-peak voltage of eight volts (8 V), the differential voltage across input pads INA and INB again approaches four volts (4 V). Accordingly, input 104 initiates a "shift right" function on shift register 48 to set the next control bit B1 to "high". In turn, transistors Q3 and Q4 are also turned on so that resistors R3 and R4 are switched in parallel with resistors R1 and R2 to provide a lower overall parallel resistance. The resulting resistive load provides a differential voltage on input pads INA and INB equal to ¼ the amplitude of the input differential voltage on lines 26 and 28.

As the differential input voltage continues to increase, the peak-to-peak voltage potential level across input pads INA and INB will again approach the maximum allowable peak level of four volts, and the next consecutive pair of resistors will similarly be switched "in". That is, resistors R5 and R6 are likewise switched in via transistors Q5 and Q6 when the input differential voltage reaches 16 volts peak-to-peak. This provides an overall parallel resistance necessary to decrease the input differential voltage to ⅛ the initial value. Next, resistors R7 and R8 will be switched "in" when the input differential voltage reaches 32 volts. This will provide a parallel resistance necessary to reduce the input differential voltage to $1/16$ the initial value. Similarly, resistors R9 and R10 will be switched "in" when the input differential voltage reaches 64 volts to produce a parallel resistance necessary to reduce the input differential voltage to $1/32$ the initial value. Finally, resistors R11 and R12 will be switched in when input differential voltage reaches 128 volts to reduce the input differential voltage to $1/64$ the initial value.

Turning to FIG. 3, one example of the input differential voltage taken from lines 26 and 28 is illustrated in comparison with the attenuated differential voltage taken from input pads INA and INB. When the differential voltage across input pads INA and INB approach the maximum peak-to-peak amplitude of four volts, the adaptive loading circuit 24 switches "in" the next successive pair of resistors to provide a divide by two attenuation. Accordingly, as shown in FIG. 3, voltage attenuation division occurs with B0=1 at about 0.425 milliseconds, again with B1=1 at about 0.900 milliseconds and once more with B2=1 at about 1.910 milliseconds. When the maximum peak-to-peak voltage across input pads INA and INB decreases to about 240 millivolts, the last pair of resistors are switched "out" and the amount of attenuation is thereby decreased by a factor of two.

This particular six branch loading scheme therefore adequately attenuates an input differential voltage with a peak-to-peak voltage of 0 to 256 volts to within a limited voltage range of 0–5 volts without sacrificing noise immunity and accuracy. While a six branch example with resistances selected to provide a divide by two function are shown, the present invention may include more or less resistive branches and may have resistances selected to provide for different divisional factors. In addition, it is conceivable that one may employ a counter and decoder in place of the preferred shift register 48; however, a shift register is generally less susceptible to potential detection of soft errors.

Differential to Single-Ended Voltage Conversion Circuit

Referring back to FIGS. 1 and 2B, a differential to single-ended conversion scheme is shown for converting the differential voltage across input pads INA and INB to a single-ended voltage 78 which may then be processed by an adaptive threshold circuit 36. Included within the conversion scheme is a zero crossing detector 30 which can be made up of a commercially available rail-to-rail voltage comparator coupled between input pads INA and INB. Voltage comparator 30 has a positive input connected to input pad INA and a negative input connected to input pad INB. Voltage comparator 30 provides an output with a "high" state when the voltage on input pad INA exceeds the voltage on input pad INB. The output of comparator 30 switches state whenever the voltage potential on input pads INA and INB cross at the same voltage amplitude. Since bias control circuit 22 provides a symmetric DC bias, the zero-crossing should occur around the DC bias voltage of 2.5 volts.

Figure 4:
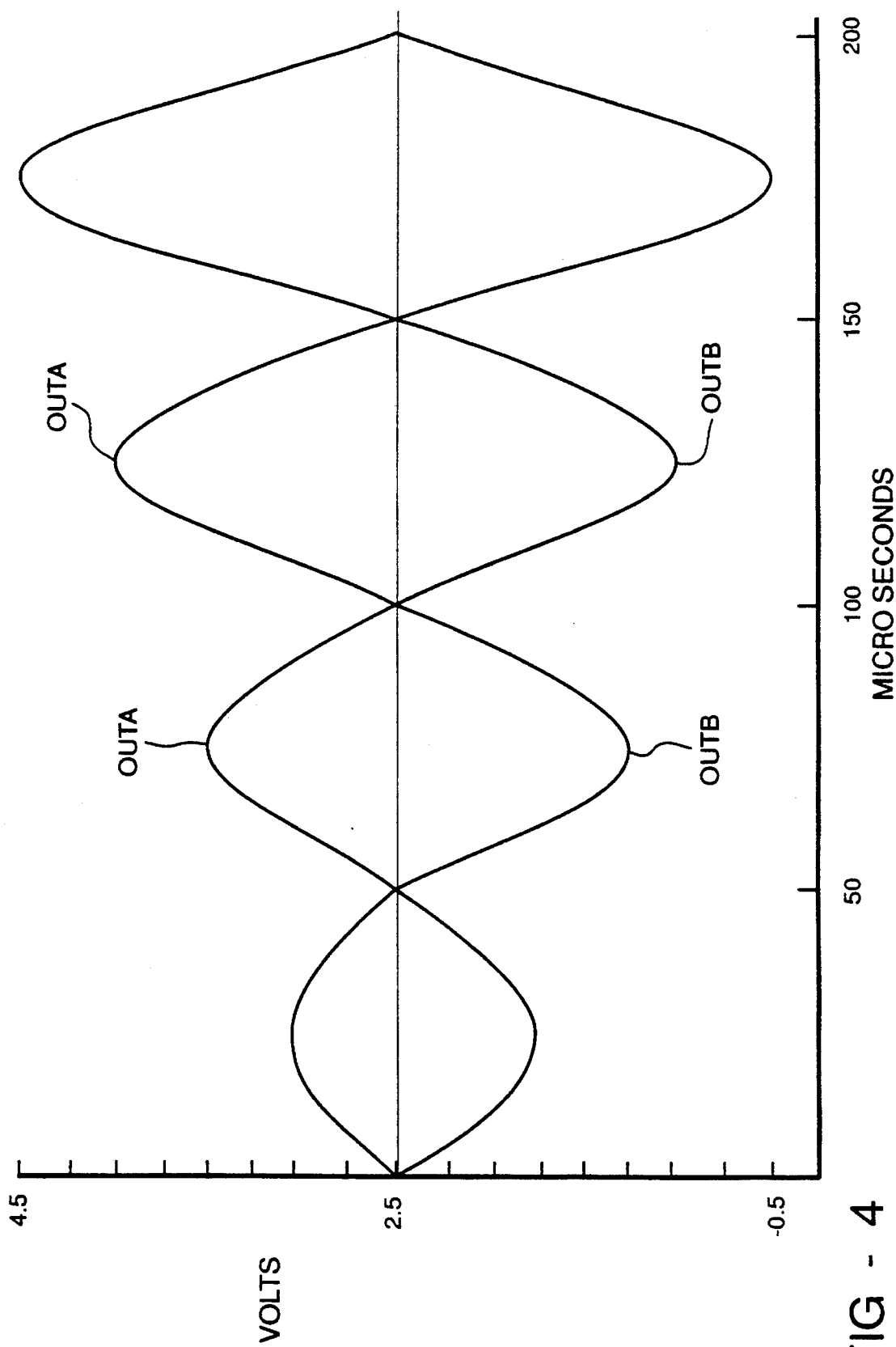
FIG. 4 is a graphical representation of rectified differential voltages provided at the outputs of a rectifier.

A rectifier 32 is connected to the output of the voltage comparator 30. The rectifier 32 is a rectification multiplexer that has a pair of voltage inputs connected to input pads INA and INB and a pair of rectifier outputs represented by OUTA and OUTB. The rectifier 32 operates to perform full-wave rectification on the differential voltage tapped from input pads INA and INB. In doing so, rectifier 32 switches back and forth between half-cycles of the voltages received from input pads INA and INB to produce full-wave rectified voltages across outputs OUTA and OUTB as illustrated by the example shown in FIG. 4. The rectifier 32 therefore performs rectification of the positive half-wave cycles (every 50 microseconds) above the DC bias voltage of the voltage waveforms from input pads INA and INB.

In order to achieve full rectification, the zero crossing detector 30 provides the rectifier 32 with the switching output which enables the rectifier 32 to switch between successive positive half-wave voltages from input pads INA and INB. The rectifier 32 then generates the rectified positive and negative voltage waveforms on outputs OUTA and OUTB. As a consequence, each of rectifier outputs OUTA and OUTB include a pair of voltage peaks per each cycle which spans about 100 microseconds, according to the example in FIG. 4. This advantageously increases (doubles) the tracking resolution of the adaptive threshold over previous designs which makes for ease in handling systems with high rates of deceleration. In addition, the twin peaks also allow for a reduced amount of circuitry that would otherwise be needed for the fault detection circuit 46.

The differential to single-ended conversion circuit 34 has a first buffer 64 and a second buffer 66 coupled to rectifier outputs OUTA and OUTB, respectively. The first buffer 64 has a positive input connected to rectifier output OUTA and a negative input connected to the output of buffer 64. The second buffer 66 has a positive input coupled to rectifier output OUTB and a negative input coupled to the output of buffer 66. The first and second buffers 64 and 66 are each made up of a rail-to-rail amplifier set up in a unity gain tied buffer configuration. The buffers 64 and 66 therefore ensure that any additional loading onto input pads INA and INB does not distort the differential voltage or adversely affect the relatively low input impedance coupled thereto.

Conversion circuit 34 further includes a difference amplifier 68 which has a positive input and a negative input and is configured with a unity gain. The positive input of difference amplifier 68 is coupled to the output of first buffer 64 via a pair of divider resistors 70 and 72. The negative input of difference amplifier 68 is likewise coupled to the output of second buffer 66 via a pair of divider resistors 74 and 76. Divider resistors 70, 72, 74 and 76 each have an equal value resistance of 50 kΩ and operate to divide each of the first and second buffer outputs in half.

The difference amplifier 68 produces a single-ended voltage output 78 which is the difference between the voltages received on the positive and negative inputs thereto. As a consequence, the 2.5 volt DC bias that is common to the positive and negative inputs is cancelled through the difference amplifier 68. Since the difference amplifier 68 eliminates the 2.5 volt DC bias and produces outputs OUTA and OUTB symmetric about 0 volts, the difference function performed by amplifier 68 results in a summation operation. In effect, the resulting single-ended voltage 78 is therefore equivalent to the peak-to-peak voltage across the rectifier outputs OUTA and OUTB.

Figure 5:
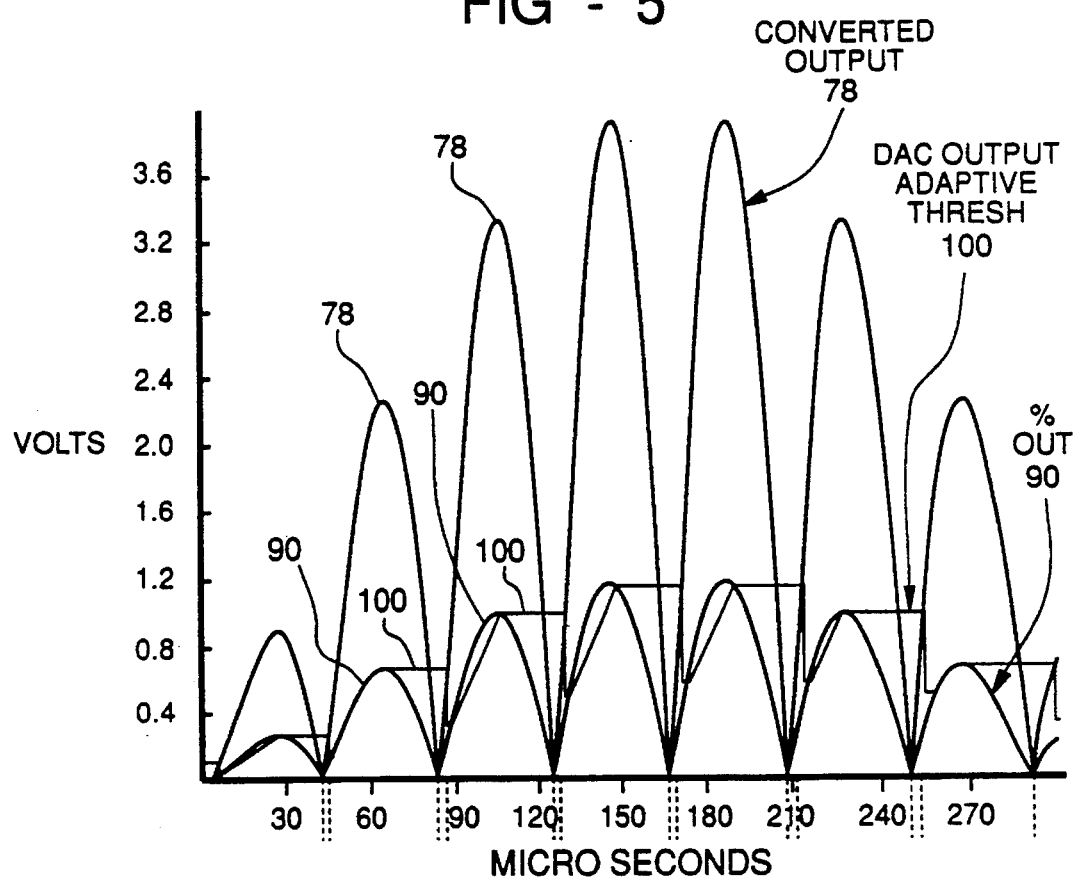
FIG. 5 is a graphical representation of a single-ended voltage produced by a differential to single-ended conversion scheme and an adaptive threshold voltage produced by an adaptive threshold circuit.

One example of a single-ended voltage output 78 is illustrated by the voltage waveform designated as 78 in FIG. 5. The differential to single-ended conversion circuit 34 advantageously allows for the use of a magnetic sensor 15 configured in a differential voltage configuration which provides common mode rejection of a differential input and makes the system less susceptible to noise interference. The conversion circuit 34 thereby effectively converts the differential voltage to a single-ended voltage which in turn may be processed by an adaptive threshold circuit 36 as discussed below in order to achieve rotational speed information about wheel 10.

Adaptive Threshold Circuit

The adaptive threshold circuit 36 and associated digital-to-analog converter (DAC) 38 are coupled to the differential to single-ended conversion circuit 34. The adaptive threshold circuit 36 includes first, second and third voltage comparators 84, 86 and 88. The first voltage comparator 84 has a positive input connected to the output of the difference amplifier 68 for receiving the single-ended voltage output 78. In addition, voltage comparator 84 has a negative input connected to an analog output of the DAC 38 for receiving an analog threshold voltage 100.

The second voltage comparator 86 has a positive input connected to the output of difference amplifier 68 via a resistor divider network 80. Resistor divider network 80 has a plurality of resistive loads R coupled to a programmable control multiplexer (not shown). Resistor divider network 80 divides the single-ended voltage 78 into a selected percent thereof which may be chosen by a user and loaded into the control multiplexer. The percent selection is generally preferred to be within a user selectable range of between twenty and fifty percent (20–50%) of the full-scale single-ended voltage output 78. A negative input to voltage comparator 86 is also connected to the analog output of the DAC 38 to receive the analog threshold voltage 100.

The third voltage comparator 88 has a positive input connected to voltage supply $V_{cc}$ via a resistor divider network 82. The resistor divider network 82 has an equivalent resistance selected so as to provide a voltage of approximately 240 millivolts to the positive input of comparator 88. A negative input of third voltage comparator 88 is likewise connected to the analog output of the DAC 38 to receive the analog threshold voltage 100.

Voltage comparators 84, 86 and 88 each have an output that is connected to the inputs of a second digital processor 94. More specifically, the output of comparator 84 is fed to an ADPTVHI input of processor 94 and also fed to one input of a latch 50. The output of comparator 86 is fed to a DACSTP input of processor 94, while the output of comparator 88 is fed to an ATTMULT input of processor 94. The digital processor 94, in turn, has a SHFTLFT output connected to line 102 and a SHFTRT output connected to both line 104 and also to a SHFTRT input of a 7-bit binary pulse counter 44. Digital processor 94 further has ENBL and RST outputs connected to corresponding ENBL and RST inputs of counter 44 for controlling the operation of binary counter 44. This is accomplished with voltage comparator 86 operating to enable binary counter 44 to initiate counting, while comparator 84 operates to reset counter 44.

The seven bit binary pulse counter 44 performs a successive binary counting operation in response to signals provided to the enable (ENBL) and reset (RST) inputs thereof. In doing so, pulse counter 44 further has a clock input 45 that is connected to a source of constant frequency clock pulses which control the count rate. The clock pulses may be supplied from digital processors 42 or 94 or other clocking sources. The seven-bit binary pulse counter 44 increments one count for each clocking cycle and has a full scale binary count of 256. In addition, counter 44 further includes seven output lines connected to the DAC 38 for supplying the DAC 38 with seven count bits C0 through C6 which contain the count magnitude.

The digital-to-analog counter (DAC) 38 is of a known type that preferably includes a resistive R2R ladder 96 which has a plurality of resistors connected in 40 kΩ and 20 kΩ resistance combinations. DAC 38 may include a commercially available off-the-shelf DAC preferably of the well known R2R ladder type configuration. The resistive ladder 96 of DAC 38 converts the digital seven-bit binary count bits C0 through C6 to an analog output to provide the analog threshold voltage 100. Analog threshold voltage 100 is therefore a function of the count magnitude generated by counter 44. The DAC 38 further includes a user interface input 40 coupled to the resistive ladder 96 for enabling a user to select the percent threshold with which to compare the single-ended voltage 78 via voltage comparators 84, 86, and 88. The percent threshold is the same as that used by divider network 80. An eight bit bus and register (not shown) or other input device may also be employed to provide a user selection of the percent threshold.

Additionally, the DAC 38 further includes a carry out output connected to digital processor 94 via line 98 for indicating a full scale count of counter 44. Upon detecting a full scale count with binary counter 44, processor 94 provides a "high" signal to input 104 to initiate a "shift right" on shift register 48 so as to successively switch "in" the next highest voltage attenuation with the adaptive loading circuit 24. In addition, processor 94, in response to voltage comparator 88, provides a "shift left" signal upon detecting a single-ended voltage of 240 millivolts or less. This in turn causes the adaptive loading circuit 24 to decrease the attenuation to the next lowest voltage division.

Figure 6:
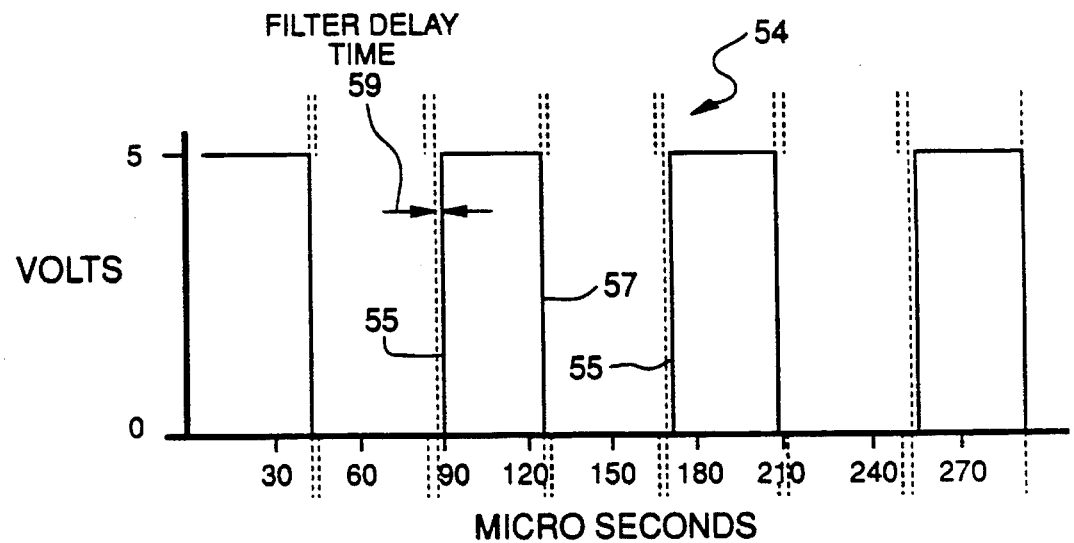
FIG. 6 is a graphical representation of a 0–5 volt digital pulse train produced by the variable reluctance interface module.

The reset latch 50 has one input connected to the output of the first voltage comparator 84 and a second input connected to the output of the zero-crossing voltage comparator 30. In effect, latch 50 detects positive or rising voltage swings generated by voltage comparator 84 and generates a rising edge voltage pulse 55 in response thereto as shown in FIG. 6. Latch 50 further detects voltage crossings between the differential voltages across input pads INA and INB as detected by zero crossing detector 30 and produces falling edges 57 in response thereto. Latch 50 has an output coupled to a filter 52 which provides a filter delay time 59 in order to filter out unwanted noise. Accordingly, an output 54 is provided via filter 52 which is in the form of a digital 0–5 volt pulse train as shown by waveform 54 in FIG. 6.

The operation of adaptive threshold circuit 36 will now be described with reference to the waveforms illustrated in FIGS. 5 and 6. A user may select a percent threshold input between a range of 20–50% via input 40, from which the DAC 38 generates an analog threshold voltage 100 as a function of the counter 44 output and the percent threshold input. The adaptive threshold circuit 36 continually compares the single-ended voltage 78 with the analog threshold voltage 100 via voltage comparator 84. A positive rising voltage pulse 55 is generated when voltage 78 reaches the voltage amplitude of the analog threshold voltage 100.

The preferred percent selected depends upon the specific application and constraints involved therewith. For example, it may be desirable to employ a low threshold percent of say twenty to thirty percent for voltages that change quickly in amplitude such as those associated with sudden acceleration and deceleration of wheel 10. However, for applications which may be subjected to higher amounts of noise, it may be desirable to select a higher percent of say forty to fifty percent so that undesirable noise does not interfere with the threshold circuitry.

The first voltage comparator 84 further operates to reset the seven-bit binary counter 44 via digital processor 94 whenever the single-ended voltage 78 exceeds the analog threshold voltage 100. Meanwhile, the second voltage comparator 86 compares voltage 90 which is a selected percent of the single-ended voltage 78 with the analog threshold voltage 100 and enables the seven-bit binary counter 44 via digital processor 94 to begin to successively count in accordance with well known binary counter schemes. By doing so, a given single-ended voltage waveform 78 is compared with a selected percent of the previously detected peak voltage. The enabled binary counter 44 begins to count and generates a count for as long as the divided single-ended waveform 90 exceeds the analog threshold voltage 100. The resulting count is a function of the peak amplitude of the single-ended voltage waveform 78 or divided waveform 90 which in turn is used to provide the new analog threshold voltage 100 for comparison with the next voltage cycle. Accordingly, the threshold voltage 100 adaptively changes between each half-cycle waveform according to the user selectable percent and the previous peak detection.

While a positive voltage pulse 55 is generated such as that shown occuring at about 90 microseconds in FIG. 6, a falling voltage pulse 57 such as that shown occuring around 125 microseconds is produced in response to the output of the zero crossing detector 30. The adaptive threshold circuit 36 monitors each half-cycle pulse of voltage 78 to determine the adaptive threshold voltage 100. However, circuit 36 only produces a rising voltage pulse 57 on output 54 for every other half-cycle so as to generate a digital pulse train 54 which matches the frequency over a full cycle. Accordingly, the next rising voltage pulse 55 occurs at approximately 170 microseconds. The resulting pulse train 54 further includes a filter delay time 59 provided by filter 52 to eliminate any unwanted noise.

The seven-bit binary counter 44 may further include the ability to disable one or both of the least significant bits. This in effect changes the binary counter 44 to a five or six bit counter. The disabling of one or two bits is accomplished with the carry out output of counter 44 and the least two significant digits in the binary counter 44. For instance, bit C0 may be disregarded to provide a full scale count of 128. This adjustment may be especially desirable for higher frequency signals where increased counting speed is more desirable.

Fault Detection Circuit

The fault detection circuit 46 continuously monitors the rectifier outputs OUTA and OUTB for purposes of determining whether a short circuit is sensed along output lines 18 and 20 of sensor 15 and allows the interface module 25 to maintain control of the sensed signal and thereby continue to operate despite such short circuiting. The fault detection circuit 46 includes a rail-to-rail voltage comparator 106 which has a positive input coupled to rectifier output OUTA and a negative input coupled to a first multiplexer 112 and a second multiplexer 114. A P-channel input voltage comparator 108 is provided which has a positive input coupled to rectifier output OUTB and a negative input coupled to a third multiplexer 116. In turn, multiplexers 112, 114 and 116 are each connected to a threshold multiplexer 118.

The first multiplexer 112 is loaded with a voltage threshold that is representative of an open circuit. The second multiplexer 114 is loaded with a voltage threshold that is representative of a short circuit to power source $V_{cc}$. The third multiplexer 116 is loaded with a voltage threshold that is representative of a short circuit to ground. Each of multiplexers 112, 114 and 116 may be loaded with the appropriate voltage thresholds via the threshold multiplexer 118.

The rail-to-rail voltage comparator 106 compares rectifier output OUTA with the threshold voltage provided by multiplexer 114 and provides an output to digital processor 42. The P-channel input voltage comparator 108 likewise compares rectifier output OUTB with the threshold voltage provided by multiplexer 116 and provides an output to digital processor 42. In turn, digital processor 42 processes the comparator outputs and produces an output signal SNGLND 110.

A state machine 55 or other processing device may be included with digital processor 42 to perform the processing of the outputs from voltage comparators 106 and 108. The state machine 55 monitors the zero crossing and each comparator output and decides whether a detected fault is the result of a short circuit to ground or a short circuit to a power source $V_{cc}$, and further determines whether the fault occurred on sensor output line 18 or line 20. In addition, the state machine 55 further determines whether rectifier outputs OUTA or OUTB are to be locked out so as to achieve the highest amplitude signal from the difference amplifier 68.

The fault detection circuit 46 operates so as to detect increased voltage amplitudes on either of the rectifier outputs OUTA or OUTB. Given a differential voltage, a short circuit along either of sensor output lines 18 or 20 would in effect pull the short circuit line to a voltage of about the same voltage potential to which it is shorted. That is, a short circuit to ground will tend to pull the voltage on that associated output line to ground, while a short circuit to a voltage source $V_{cc}$ will tend to pull the voltage associated on that line to approximately $V_{cc}$. The remaining output line that is not short circuited counterbalances the short-circuiting effect by increasing in amplitude to provide about the same overall peak-to-peak voltage amplitude as the differential voltage. Accordingly, by monitoring increases in voltage amplitude on rectifier outputs OUTA and OUTB, the voltage comparators 106 and 108 are able-to determine whether or not a short circuit has occurred. The comparator outputs are processed by state machine 55 of processor 42 which in turn generates a "high" or "low" output correction signal SNGLND 110.

The correction signal SNGLND 110 is coupled to a plurality of transistors Q13 through Q18 which in turn are connected between each of resistive branches 27A through 27F and ground as shown in FIG. 2A. Upon detecting a short-circuit fault, signal SNGLND 110 goes "high" thereby causing transistors Q13 through Q18 to turn "on". This in effect causes the differential voltage across sensor output lines 18 and 20 to be pulled to ground and thereby forms two single-ended voltages; one single-ended voltage across input pad INA and another single-ended voltage across input pad INB, both of which exist relative to ground. The state machine 55 further determines which rectifier output OUTA or OUTB is associated with the short circuit. Accordingly, correction signal SNGLND 110 initiates a fault correction so as to allow for continued operation of a given system, despite the existence of a short circuit fault.

The operation of the fault detection circuit 46 will now be described in connection with FIGS. 7A through 7D which illustrate voltage waveforms measured at different locations of interface module 25 over three conditions. The first condition illustrates normal operation and occurs over a time period of zero to about five milliseconds. The second condition illustrates the occurrence of a short circuit to ground starting at a time of about five millisecond. The third condition illustrates the initiation of a single-ended fault detection mode beginning at a time of about seven milliseconds.

According to FIG. 7A, the input differential voltage produced at sensor output lines 18 and 20 is shown with the occurrence of a short circuit to ground occurring on line 18 at approximately five milliseconds. In response, the voltage on line 20 increases in magnitude to maintain substantially the same-peak-to-peak voltage between lines 18 and 20. Turning to FIG. 7B, the differential voltage across input pads INA and INB is shown therein. Due to the limitations of the circuitry, a portion of the voltage across input pad INA is cut off whereas a substantial portion of the voltage across input pad INB remains. Next, referring to FIG. 7C, the rectifier outputs OUTA and OUTB are shown after buffers 64 and 66. Finally, the single-ended voltage 78 is shown in FIG. 7D.

When a short circuit fault occurs along either of sensor output lines 18 or 20, voltage comparators 106 or 108 will detect the change in amplitude at rectifier outputs OUTA and OUTB in order to determine the occurrence of a short circuit fault. The state machine 55 in turn produces the output 110 which turns "on" transistors Q13 through Q18 at approximately six to eight milliseconds. This in turn forms a pair of single-ended voltages across input pads INA and INB and allows the variable reluctance sensor interface module 25 to continue to operate despite such a fault. The occurance of a fault will cause an offset voltage across the sensor which may cause some error in the zero crossing detection. However, any such error will generally only cause problems with very low input signals.

In addition, the fault detection circuit 46 further operates to detect open circuit faults. This is accomplished by using the digital processor 42 to periodically check for lack of an output pulse train which may indicate the possibility of an open circuit fault and then initiating a signal that will put the circuit into an open circuit test mode. In the open circuit test mode, the open multiplexer 112 is switched to provide a new threshold for voltage comparator 106 of approximately 0.7 volts. If the sensor has an open circuit fault, the impedance between lines 18 and 20 will exceed a selected amount of say 10 kilohms.

While this invention has been disclosed in connection with a particular example thereof, no limitation is intended thereby except as defined in the following claims. This is because a skilled practitioner recognizes that other modifications can be made without departing from the spirit of this invention after studying the specification and drawings.

We claim:

1. An adaptive threshold circuit for developing a series of square-wave voltage pulses from an alternating differential voltage that is produced by a sensor in response to the rotation of a wheel, comprising:

an input circuit for providing an input voltage in response to the alternating differential voltage;

a first voltage comparator for comparing said input voltage with an adaptive analog threshold voltage and producing an output in response thereto that causes a rising edge of said square-wave voltage pulse;

a second voltage comparator for comparing a selected portion of said input voltage with said adaptive analog threshold voltage and producing an output in response thereto;

a binary counter having a reset input for receiving said first voltage comparator output and an enable input for receiving said second voltage comparator output and a plurality of binary outputs, wherein said second voltage comparator output enables the counter so as to generate a count magnitude which is a function of peak input voltage; and a digital-to-analog converter for receiving the binary outputs from said binary counter and generating said adaptive analog threshold voltage as a function of a selected percent of said peak voltage;

wherein said input circuit includes an adaptive attenuation circuit having a plurality of selectable resistors, which are selected in response to said binary counter outputs.

2. The circuit as defined in claim 1 further comprising a third voltage comparator for comparing a predetermined voltage with the adaptive analog threshold voltage and providing an output for determining the selection of said plurality of resistors.

3. The circuit as defined in claim 1 wherein said input circuit further comprises a differential to single-ended voltage conversion circuit for converting the alternating differential voltage into said input voltage.

4. An apparatus for developing a series of square-wave voltage pulses that are developed during rotation of a rotatable wheel comprising:

a magnetic sensor associated with said wheel having a pick-up coil and means on said wheel for causing an alternating differential voltage to be generated in said pick-up coil when said wheel rotates relative to said sensor;

an adaptive loading circuit coupled to said sensor for providing an adaptively controlled input voltage in response to said differential voltage;

a first voltage comparator for comparing said input voltage with an adaptive analog threshold voltage and producing an output which provides a rising edge for the square-wave voltage pulse;

a second voltage comparator for comparing a selected portion of said input voltage with said adaptive analog threshold voltage and producing an output;

a binary counter having a reset input for receiving said first voltage comparator output and an enable input for receiving said second voltage comparator output and a plurality of binary outputs, wherein said second voltage comparator output enables the counter so as to generate a count magnitude which is a function of peak input voltage; and a digital-to-analog converter for receiving the binary outputs from said binary counter and generating said adaptive analog threshold voltage as a function of a selected percent of peak voltage.

5. The apparatus as defined in claim 4 wherein said input circuit includes an adaptive attenuation circuit having a plurality of selectable resistors, which are selected in response to said binary counter outputs.

6. The apparatus as defined in claim 5 further comprising a third voltage comparator for comparing a predetermined voltage with the adaptive analog threshold voltage and providing an output for determining the selection of said plurality of resistors.

7. The apparatus as defined in claim 4 wherein said input circuit further comprises a differential to single-ended voltage conversion circuit for converting the alternating differential voltage into said input voltage.

* * * * *